US011135723B2

(12) United States Patent
Berry et al.

(10) Patent No.: US 11,135,723 B2
(45) Date of Patent: Oct. 5, 2021

(54) ROBOTICS FOR THEME PARK WEARABLE SOFTWARE TESTING

(71) Applicant: Universal City Studios LLC, Universal City, CA (US)

(72) Inventors: Joshua Aaron Berry, Westmont, NJ (US); Miguel Antonio Montijo, Jr., Clermont, FL (US); Brian Keith Copeland, Burlington, KY (US)

(73) Assignee: Universal City Studios LLC, Universal City, CA (US)

( * ) Notice: Subject to any disclaimer, the term of this patent is extended or adjusted under 35 U.S.C. 154(b) by 342 days.

(21) Appl. No.: 16/402,951

(22) Filed: May 3, 2019

(65) Prior Publication Data

US 2020/0114510 A1 Apr. 16, 2020

Related U.S. Application Data

(60) Provisional application No. 62/755,831, filed on Nov. 5, 2018, provisional application No. 62/744,998, filed on Oct. 12, 2018.

(51) Int. Cl.
*G06F 1/16* (2006.01)
*G05B 19/4063* (2006.01)
(Continued)

(52) U.S. Cl.
CPC ........... *B25J 9/1674* (2013.01); *B25J 9/1628* (2013.01); *B25J 9/1692* (2013.01);
(Continued)

(58) Field of Classification Search
CPC ............ G01R 31/2834; G01R 31/3025; G05B 19/00; G05B 19/4063; G05B 19/418; G05B 2219/40602; G06F 1/163; Y02P 90/02
See application file for complete search history.

(56) References Cited

U.S. PATENT DOCUMENTS 9,283,672 B1 * 3/2016 Matthews ........... G01M 99/008
9,477,855 B2 * 10/2016 Somani .................. B25J 9/1679
(Continued)

FOREIGN PATENT DOCUMENTS

CN 204086421 1/2015

OTHER PUBLICATIONS

PCT/US2019/055020 International Search Report and Written Opinion dated Mar. 6, 2020.
(Continued)

*Primary Examiner* — David Bilodeau
(74) *Attorney, Agent, or Firm* — Fletcher Yoder P.C.

(57) ABSTRACT

Systems and methods presented herein include a robotic wearable device testing system with a track drive system that includes one or more tracks having a plurality of attachment pads configured to attach to one or more wearable devices. Each track of the one or more tracks is configured to move along a path defined by the track. In addition, the robotic wearable device testing system includes a tap point drive system that includes one or more tap point sliders configured to slide laterally with respect to the track drive system. Each tap point slider of the one or more tap point sliders includes a tap point configured to wirelessly communicate with the one or more wearable devices when the one or more wearable devices are in close proximity with the tap point. Each tap point slider of the one or more tap point sliders also includes an electronic interference door configured to block wireless signals between the one or more wearable devices and the tap point. The robotic wearable device testing system also includes control circuitry configured to control relative movement of the one or more tracks and the one or more tap point sliders to position one or more wearable devices attached to respective attachment pads of the plurality of attachment pads in close
(Continued)

proximity with a tap point of the one or more tap point sliders, and to control movement of the electronic interference door to allow or block the wireless signals between the one or more wearable devices and the tap point of the one or more tap point sliders.

21 Claims, 11 Drawing Sheets

(51) Int. Cl.
    *G01R 31/28*     (2006.01)
    *B25J 9/16*     (2006.01)
    *G06K 19/06*     (2006.01)
    *G01R 31/302*     (2006.01)
    *G05B 19/00*     (2006.01)
    *H04W 4/80*     (2018.01)

(52) U.S. Cl.
    CPC ..... *G01R 31/2834* (2013.01); *G01R 31/3025* (2013.01); *G05B 19/00* (2013.01); *G05B 19/4063* (2013.01); *G06F 1/163* (2013.01); *G06K 19/06037* (2013.01); *G05B 2219/40602* (2013.01); *H04W 4/80* (2018.02)

(56) References Cited

U.S. PATENT DOCUMENTS

| | | |
|---|---|---|
| 2004/0263494 A1* | 12/2004 | Poor ........................ A63F 13/10 |
| | | 345/204 |
| 2007/0210983 A1* | 9/2007 | Dove ....................... G06F 1/163 |
| | | 345/2.1 |
| 2013/0200911 A1 | 8/2013 | Panagas |
| 2017/0339335 A1 | 11/2017 | Kuokkanen et al. |
| 2018/0018680 A1* | 1/2018 | Bs .......................... G06F 11/368 |
| 2018/0089522 A1 | 3/2018 | Sami et al. |
| 2018/0247326 A1* | 8/2018 | Cronin ................ G06K 7/10425 |

OTHER PUBLICATIONS

Touch Panel Performance Test System with 6-axis robot and new stylus tests, OptoFidelity, Sep. 2, 2014. https://www.youtube.com/watch?v=uy2CQ0xR5Ac.

* cited by examiner

ROBOTICS FOR THEME PARK WEARABLE SOFTWARE TESTING

CROSS-REFERENCE TO RELATED APPLICATIONS

This application claims priority to and the benefit of U.S. Provisional Application No. 62/744,998, entitled "Robotics for Theme Park Wearable Software Testing," filed Oct. 12, 2018, and U.S. Provisional Application No. 62/755,831, entitled "Robotics for Theme Park Wearable Software Testing," filed Nov. 5, 2018, both of which are hereby incorporated by reference in their entireties for all purposes.

FIELD OF DISCLOSURE

The present disclosure relates generally to wearable device software testing. More specifically, embodiments of the present disclosure relate to systems and methods for facilitating robotic testing of software systems for wearable devices.

BACKGROUND

Theme parks sometimes employ wearable devices that allow patrons to interact with specific in-park experiences such as reserving a place in a virtual line for a ride or reserving a table in a restaurant without having to carry a wallet or cell phone around the theme park. Often, each wearable device is encoded with a unique identifier for the specific patron, thus, any given wearable device cannot be used by other patrons. In addition, a wireless interface between the wearable device and "tap points" disposed around the theme park may be proprietary to the manufacturer of the wearable device.

To perform software testing of the various in-park applications (e.g., a front gate, virtual lines, and so forth), testers conventionally have to manually touch the wearable device to a tap point. When in isolation, this is not a lengthy task, but many of the tests for virtual lines often require dozens to hundreds of taps to occur, all at relatively precise timing intervals. In addition, other tests such as validating error screens throughout the theme park may require dozens of taps to, for example, set appropriate pre-conditions.

As such, conventional software testing of theme park wearable devices is relatively slow and manual, limiting highly skilled testers to performing a role of rote device tapping and are, thus, prevented from performing cerebral activities like improving test cases or test data. Additionally, in general, testers must keep track of the state of each wearable device and, in some cases, the type of entitlements to which the particular devices are linked. In addition, due to the nature of theme parks, the wearable devices are typically purged from the system daily so that the wearable devices are reentered into the system before subsequent use by other patrons. As such, in a test setting, engineers have to manually re-tap each wearable device each day before they can be used. Because of the proprietary nature of the wearable technology, test engineers are limited in creating means of automated software testing through traditional means. Therefore, there is a need for improvements in software test automation for theme park wearable devices that includes integrating physical movement of the wearable devices through the use of robotics.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the subject matter. Indeed, the subject matter may encompass a variety of forms that may be similar to or different from the embodiments set forth below.

In certain embodiments, a robotic wearable device testing system includes a track drive system that includes one or more tracks having a plurality of attachment pads configured to attach to one or more wearable devices. Each track of the one or more tracks is configured to move along a path defined by the track. In addition, the robotic wearable device testing system includes a tap point drive system that includes one or more tap point sliders configured to slide laterally with respect to the track drive system. Each tap point slider of the one or more tap point sliders includes a tap point configured to wirelessly communicate with the one or more wearable devices when the one or more wearable devices are in close proximity with the tap point. Each tap point slider of the one or more tap point sliders also includes an electronic interference door configured to block wireless signals between the one or more wearable devices and the tap point. The robotic wearable device testing system also includes control circuitry configured to control relative movement of the one or more tracks and the one or more tap point sliders to position one or more wearable devices attached to respective attachment pads of the plurality of attachment pads in close proximity with a tap point of the one or more tap point sliders, and to control movement of the electronic interference door to allow or block the wireless signals between the one or more wearable devices and the tap point of the one or more tap point sliders.

In addition, in certain embodiments, a method includes controlling, via control circuitry of a robotic wearable device testing system, movement of one or more tracks and one or more tap point sliders relative to each other. Each track of the one or more tracks is configured to have one or more wearable devices attached thereto, wherein each tap point slider of the one or more tap point sliders includes a tap point configured to wirelessly communicate with the one or more wearable devices when the one or more wearable devices are in close proximity with the tap point. Each tap point slider of the one or more tap point sliders also includes an electronic interference door configured to block wireless signals between the one or more wearable devices and the respective tap point. The method also includes controlling, via the control circuitry, movement of the electronic interference door to allow or block the wireless signals between the one or more wearable devices and a tap point of the one or more tap point sliders. The method further includes processing, via the control circuitry, the wireless signals between the one or more wearable devices and the tap point of the one or more tap point sliders.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Further, to the extent that certain terms such as parallel, perpendicular, and so forth are used herein, it should be understood that these terms allow for certain deviations from a strict mathematical definition, for example to allow for deviations associated with manufacturing imperfections and associated tolerances.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Figure 1:
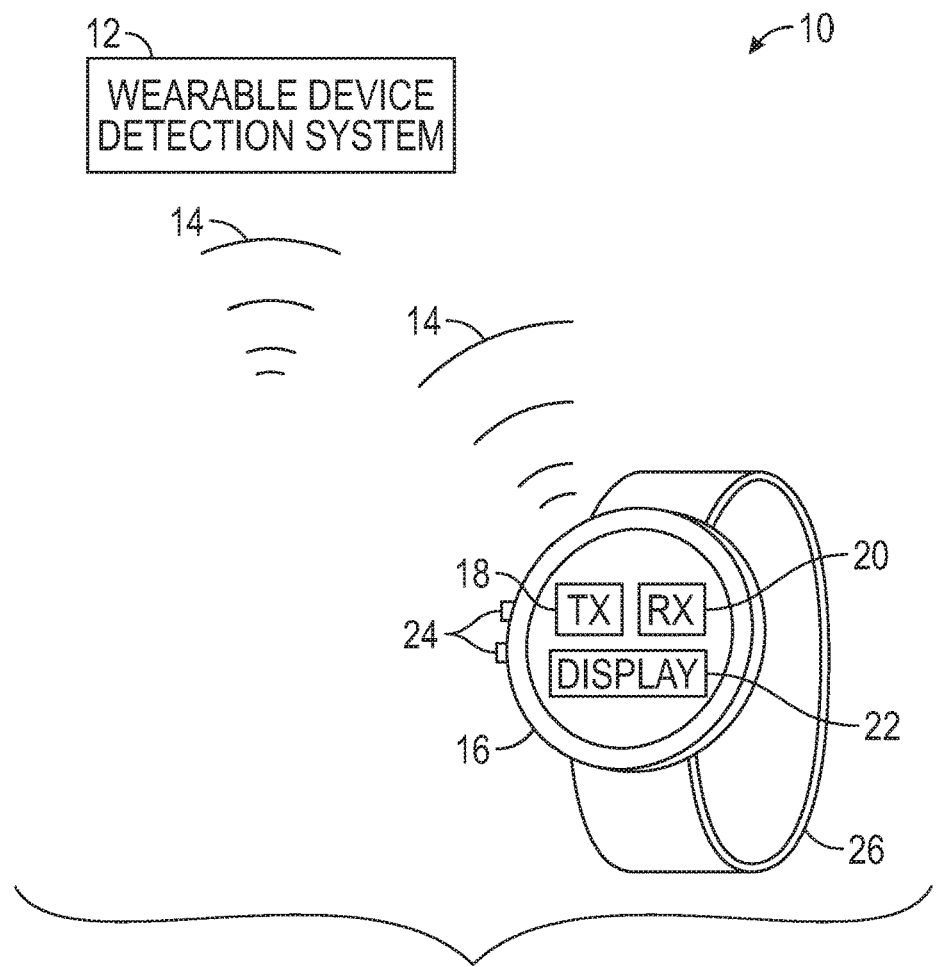
FIG. 1 is a wireless system including a wearable device and a wearable device detection system, in accordance with embodiments the present disclosure.

Referring now to FIG. 1, a wireless system 10 may include a wearable device detection system 12 communicating via wireless signals 14 with a wearable device 16. The wearable device 16 may be any suitable electronic device configured to be worn by a patron of a theme park and having a transmitter 18 and/or a receiver 20. Although illustrated in FIG. 1 as being in the form of a watch-like electronic device, in other embodiments, the wearable device 16 may instead be in the form of a bracelet, a necklace, a headband, a ring, or any other conveniently wearable item. In certain embodiments, the wearable device 16 may include a display 22 (e.g., lights, a screen, and so forth) and/or an interface 24 (e.g., keyboard, touchscreen, buttons, and so forth). In certain embodiments, to facilitate wearing of the wearable device 16, a retaining feature 26 such as a bracelet, necklace, lanyard, or suction-cup mount may be used to secure the wearable device 16 in place. Other retaining features 26 may be used depending on implementation and/or desired location such as, but not limited to, screws, adhesive, clips, and/or friction locks.

In certain embodiments, the transmitter 18 and the receiver 20 of the wearable device 16 may be implemented together as a transceiver. In certain embodiments, the wearable device 16 may use one or more frequency bands to communicate with the wearable device detection system 12. In certain embodiments, the wearable device 16 may periodically broadcast, within its range, a wearable device identifier that may be unique to the implementation in which the wearable device 16 is used, such that other devices, which are not desired to be detected by the wearable device detection system 12, are not registered as false alarms. For example, in certain embodiments, other devices not desired to be detected by the wearable device detection system 12 (e.g., mobile phones, tablets, and other electronic devices not associated with the wireless system 10) may broadcast foreign wireless signals that may be received by the wireless system 10 but that are not recognized or considered. The use of a wearable device identifier may prevent the wearable device detection system 12 from registering or recognizing such other devices as a wearable device 16 of the wireless system 10.

Figure 2:
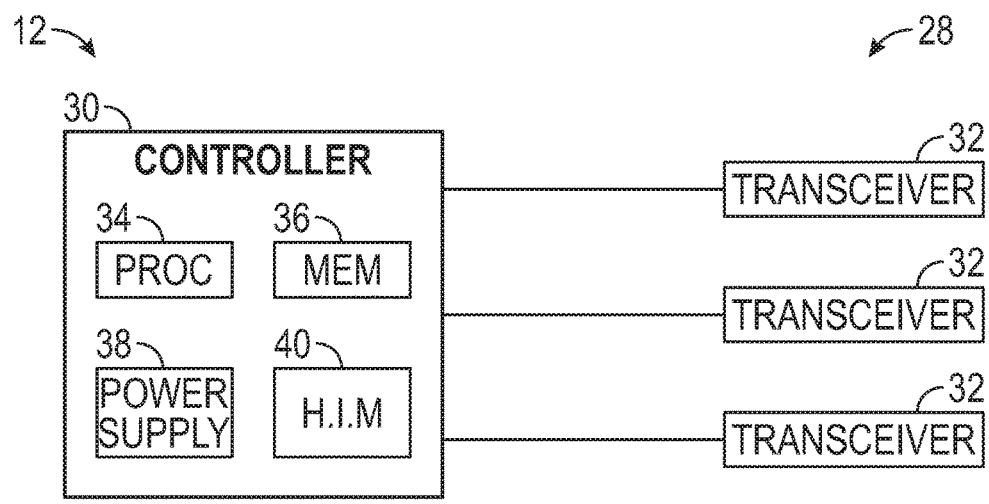
FIG. 2 is a block diagram of a wearable device detection system, in accordance with embodiments of the present disclosure.

As shown in FIG. 2, in certain embodiments, the wearable device detection system 12 may include a transceiver array 28 and a controller 30. The transceiver array 28 may include multiple transceivers 32 disposed throughout a theme park to detect wearable devices 16 being used by patrons of the theme park. Each transceiver 32 may be connected, wirelessly or through a wired connection, to the controller 30. The controller 30 may utilize one or more processors 34 and memory 36 to process the detections of the wearable devices 16 by the transceivers 32. In certain embodiments, the one or more processors 34 may include one or more general purpose microprocessors, one or more application specific integrated circuits (ASICs), one or more field programmable logic arrays (FPGAs), or any combination thereof. Further, in certain embodiments, the memory 36 may store data to be processed by the one or more processors 34 and may include one or more tangible, non-transitory, computer-readable media. For example, the memory 36 may include random access memory (RAM), read only memory (ROM), rewritable non-volatile memory such as flash memory, hard drives, optical discs, and/or the like. Additionally, in certain embodiments, the controller 30 may include an internal or external power supply 38. As such, power may be supplied via an electrical power grid and/or via a battery. In certain embodiments, the power supply 38 may also include one or more transformers and may provide power to the transceivers 32. Additionally, in certain embodiments, a human interface module 40 may be included to, for example, allow a technician to program the wearable device detection system 12.

In certain embodiments, the transceivers 32 and the wearable devices 16 may communicate with two-way communication, for example, by logging the wearable device identifiers for the wearable devices 16, and keeping track of the wearable devices 16 via the transceivers 32. As such, the wearable device identifiers may be communicated to or pre-programmed into the wearable device detection system 12 to allow the wearable devices 16 to provide specific services for the patrons using the wearable devices 16. Furthermore, in certain embodiments, the wearable device detection system 12 may be networked to a larger wireless network that may include multiple base stations, repeaters, receivers, controllers, and so forth, or operate separately from a network environment. Additionally or alternatively, one-way wireless communication may also allow the wearable device detection system 12 to operate within a network, when connected, but still operate when disconnected, or be used as a standalone system. Furthermore, two-way communication may be implemented while a network is active, and one-way communication may be used if connection to the network is lost by the wearable device 16.

The wearable devices 16 and the wearable device detection system 12 enable, for example, virtual line systems for theme parks. In addition, in certain embodiments, the virtual line system may be operated in conjunction with software for allocation of or entry to a virtual line via a "tap point" module, software for ride validation via a "tap point" module, and other control system components. It should be noted that, while described primarily herein as "tapping" wearable devices 16 against tap points, the "tapping" described herein is intended to mean bringing the wearable devices 16 into close enough proximity (e.g., within less than 2.0 inches, within less than 1.5 inches, within less than 1.0 inches, within less than 0.5 inches, or even closer) such that the wireless transmitters 18, wireless receivers 20, and wireless transceivers 32 described herein may communicate with each other.

Certain implementations of wireless transmitters 18, wireless receivers 20, and wireless transceivers 32 that facilitate communication between the wearable devices 16 and the wearable device detection system 12 include certain services such as virtual line notifications, payment verifications, and so forth, which may be accommodated by wireless transmissions and receptions. Such services may use a wide variety of radio frequency (RF) bands such as those used in radio frequency identification (RFID), near-field communication (NFC), Wi-Fi, Bluetooth, global positioning system (GPS), very high frequency (VHF), and the like.

As described above, conventional software testing of theme park wearable devices is relatively slow and manual, limiting highly skilled testers to performing a relatively monotonous role of rote device tapping and are, thus, prevented from performing cerebral activities like improving test cases or test data. Additionally, in general, testers must keep track of the state of each wearable device and, in some cases, the type of entitlements to which the particular devices are linked. In addition, due to the nature of theme parks, the wearable devices are typically purged from the system daily so that the wearable devices may be reentered into the system before subsequent use by other patrons.

The embodiments of the present disclosure address the shortcomings of conventional software testing of theme park wearable devices by utilizing a robotic solution to test the physical aspects of the wearable devices 16 in conjunction with existing application programming interface (API) and user interface automation to bridge the automation gap for a thorough testing solution. By utilizing a robotic solution for testing of the wearable devices 16, the testing may be performed outside of business hours since human testers are not required other than setting up the robotic testing. In addition, the robotic testing is relatively more consistent than human testing, which can be relatively error prone. Further, the robotic testing requires only a relatively small physical space footprint and a relatively small team to maintain, as opposed to the relatively large teams and space required for manual testing.

The embodiments described herein apply robotic-based software automation to theme park wearable devices 16 to perform the mechanical tapping as part of a test automation script or robotic process automation to load wearable devices 16 into the theme park system. As described herein, the term "robotics" is intended to include both physical electro-mechanical equipment such as beams, pulleys, servos, control boards, and so forth, as well as the software control and all communication between a control system and the physical equipment. In general, the embodiments described herein implement the testing of the wearable devices 16 by facilitating the placement of specific wearable devices 16 among a plurality of wearable devices 16 into exact positions relative to tap points, and bringing the specific wearable devices 16 into close proximity to the tap points for the "tapping" to occur as if a patron of the theme park had touched the wearable device 16 to the tap point.

In particular, as described in greater detail herein, the embodiments of the present disclosure include robotic systems configured to place the wearable devices 16 at known locations by moving them along a track drive. In certain embodiments, the track is indexed such that the control software described herein knows the location of any particular wearable device 16 on the track, and the robotics can place any of the wearable devices 16 on the track at any location around the track's chassis. To perform the physical touching/proximity of the wearable devices 16 to the tap points, certain embodiments described herein physically slide a particular tap point until it is relatively close to a wearable device 16, place an electro-magnetic blocking material between the wearable device 16 and the tap point, then remove the electro-magnetic blocking material to allow wireless communication between the wearable device 16 and the tap point.

Figure 3:
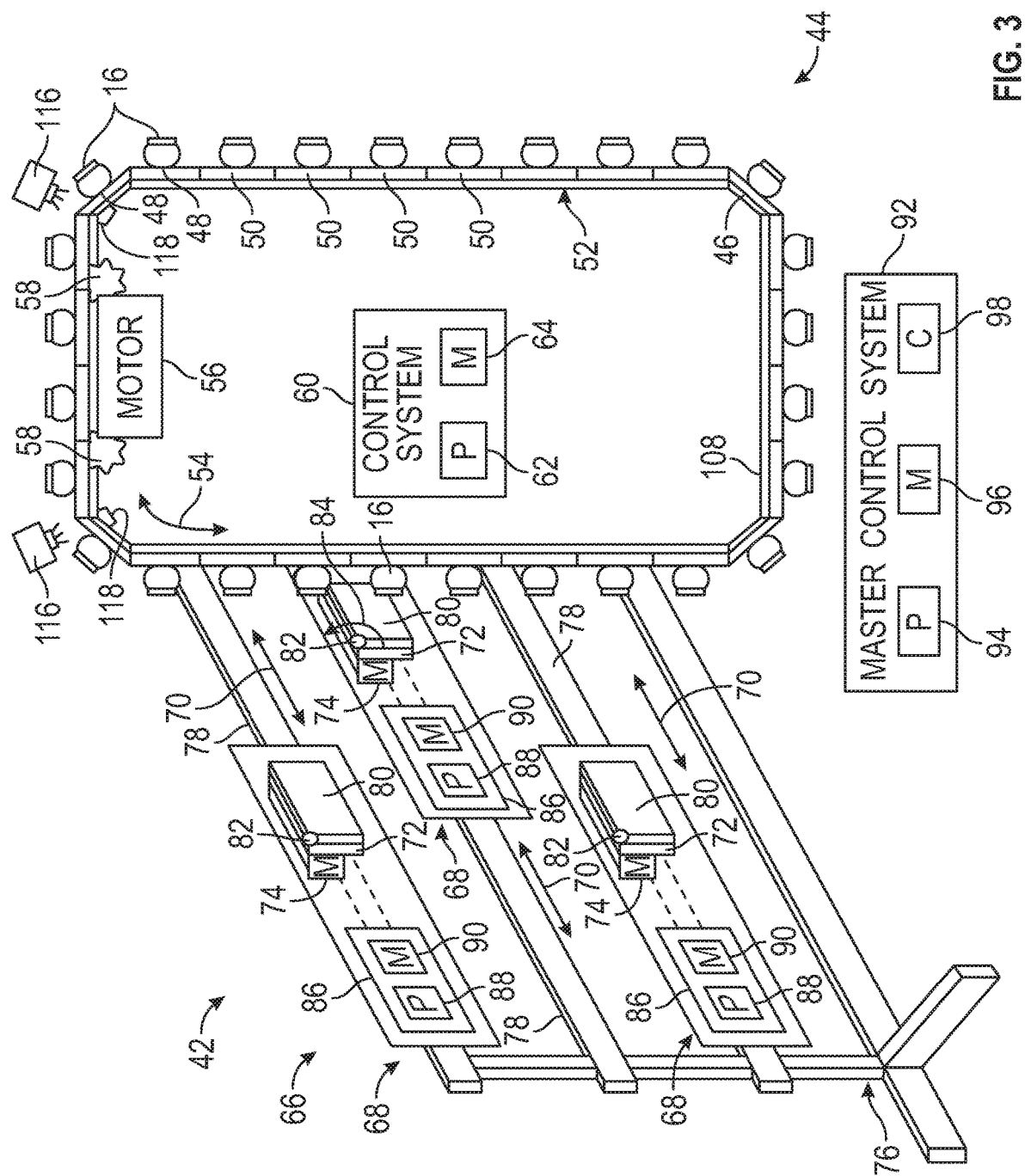
FIG. 3 is a schematic diagram of a robotic wearable device testing system, in accordance with embodiments of the present disclosure.

FIG. 3 is a schematic diagram of a robotic wearable device testing system 42, in accordance with embodiments of the present disclosure. As illustrated in FIG. 3, in certain embodiments, the wearable device testing system 42 may include one or more track drive systems 44 that are each configured to have a plurality of wearable devices 16 attached to a track 46 of the respective track drive system 44 via a plurality of attachment pads 48 disposed along the track 46. It should be noted that, while only one track drive system 44 is illustrated in FIG. 3, any number of track drive systems 44 may be used as part of the wearable device testing system 42.

In certain embodiments, the tracks 46 of the track drive systems 44 may each include a plurality of track members 50 coupled to each other along a path 52 defined by the respective track 46 (i.e., defined by the plurality of track members 50 of the track 46). In general, the plurality of track members 50 have relatively flat shaped surfaces, which facilitate the track members 50 moving along the path 52 defined by the track 46. In certain embodiments, the plurality of attachment pads 48 may either be attached to certain track members 50 or, alternatively, be certain track members 50. In certain embodiments, the attachment pads 48 may include Velcro® or any other material or feature suitable for attaching the wearable devices 16 to the attachment pads 48.

In general, each track drive system 44 is configured to drive motion of the track 46 along the path 52 defined by the track 46 (e.g., as illustrated by arrow 54) such that the wearable devices 16 attached to the attachment pads 48 of the track 46 move along the path 52. For example, in certain embodiments, the track drive system 44 may include a motor 56 (e.g., a stepper motor, servo motor, or other suitable motor) coupled to the track 46 and configured to cause the track 46 to move along the path 52 defined by the track 46 (e.g., via a series of gears 58 that interact with certain track members 50 of the track 46, in certain embodiments). In certain embodiments, the motor 56 may be a stepper motor, which may provide relatively precise movement of the track 46 along the path 52 defined by the track 46 in both directions (e.g., forward motion and backward motion along the path 52).

In certain embodiments, each track drive system 44 may include a track drive control system 60 configured to control motion of the track 46 along the path 52 defined by the track 46. More specifically, in certain embodiments, the track drive control system 60 may utilize one or more processors 62 and memory 64 to control the motor 56 of the track drive system 44 to move the track 46 along the path 52 defined by the track 46. In certain embodiments, the one or more processors 62 may include one or more general purpose microprocessors, one or more application specific integrated circuits (ASICs), one or more field programmable logic arrays (FPGAs), or any combination thereof. Further, in certain embodiments, the memory 64 may store data to be processed by the one or more processors 62 and may include one or more tangible, non-transitory, computer-readable media. For example, the memory 64 may include random access memory (RAM), read only memory (ROM), rewritable non-volatile memory such as flash memory, hard drives, optical discs, and/or the like.

As also illustrated in FIG. 3, in certain embodiments, the wearable device testing system 42 may include a tap point drive system 66 that includes one or more tap point sliders 68 that are each configured to slide laterally with respect to the one or more track drive systems 44 (e.g., as illustrated by arrows 70) such that a respective tap point 72 of each tap point slider 68 may be moved proximate to one or more of the wearable devices 16 that are attached to a track 46 of a track drive system 44 for the purpose of simulating a "tap" of a particular wearable device 16 to a particular tap point 72. In general, the tap points 72 of the tap point sliders 68 are configured to simulate the functionality of the transceivers 32 of the wearable device detection system 12 illustrated in FIGS. 1 and 2, for testing purposes.

In certain embodiments, the tap point drive system 66 may include one or more motors 74 (e.g., servo motors, stepper motors, or other suitable motors) configured to drive motion of respective tap point sliders 68 with respect to a chassis 76 of the tap point drive system 66 such that the one or more tap point sliders 68 slide laterally with respect to the track drive system 44. For example, in certain embodiments, the one or more motors 74 of the tap point drive system 66 may include gears that interact directly with respective rails 78 such that respective tap point sliders 68 are caused to translate with respect to the rails 78, thereby causing the lateral sliding of the tap point sliders 68 with respect to the track drive systems 44. It will be appreciated that the tap point sliders 68 are configured to translate bidirectionally along the respective rails 78, in certain embodiments.

In certain embodiments, each of the tap points 72 may be associated with a respective interference door 80 that is configured to temporarily block wireless communication (e.g., RF communication, in certain embodiments) between the respective tap point 72 and a wearable device 16 that has been brought into close proximity (e.g., within 2.0 inches, within 1.5 inches, within 1.0 inch, within 0.5 inch, or even closer, in certain embodiments) with the tap point 72. In particular, in certain embodiments, the interference door 80 be comprised of an electro-magnetic blocking material configured to block wireless communication. In certain embodiments, once a particular wearable device 16 has been brought into close proximity with a particular tap point 72 (i.e., with the interference door 80 disposed between the wearable device 16 and the tap point 72), the interference door 80 may be caused to move from being disposed between the wearable device 16 and the tap point 72 such that wireless communication between the wearable device 16 and the tap point 72 can be tested. For example, in certain embodiments, the motor 74 associated with the particular tap point 72 may also cause the interference door 80 to rotate (e.g., approximately 90 degrees, or even more, in certain embodiments) relative to a pivot point 82 of the tap point 72 (e.g., as illustrated by arrow 84) such that the interference door 80 allows (i.e., no longer blocks) wireless communication between the tap point 72 and the wearable device 16 that is in close proximity to the tap point 72.

In certain embodiments, the tap point drive system 66 may include one or more tap point drive control systems 86 configured to control lateral motion of the one or more tap point sliders 68 with respect to the track drive system 44, as well as to control movement of the interference door 80 into a position where the interference door 80 no longer blocks wireless communication between a tap point 72 and a wearable device 16 that has been brought into close proximity with the tap point 72. More specifically, in certain embodiments, the tap point drive control systems 86 may each utilize one or more processors 88 and memory 90 to control respective motors 74 to move the respective tap point sliders 68 along their respective rails 78, as well as to move the respective interference doors 80 relative to the pivot points 82 of the respective tap points 72. In certain embodiments, the one or more processors 88 may include one or more general purpose microprocessors, one or more application specific integrated circuits (ASICs), one or more field programmable logic arrays (FPGAs), or any combination thereof. Further, in certain embodiments, the memory 90 may store data to be processed by the one or more processors 88 and may include one or more tangible, non-transitory, computer-readable media. For example, the memory 90 may include random access memory (RAM), read only memory (ROM), rewritable non-volatile memory such as flash memory, hard drives, optical discs, and/or the like.

As also illustrated in FIG. 3, in certain embodiments, the wearable device testing system 42 may include a master control system 92 configured to coordinate operation of the track drive system 44 and the tap point drive system 66 by, for example, coordinating control of the track drive control systems 60 and the tap point drive control systems 86. More specifically, in certain embodiments, the master control system 92 may utilize one or more processors 94 and memory 96 to control operation of the track drive control systems 60 and the tap point drive control systems 86 to ensure that the wearable devices 16 attached to the tracks 46 of the track drive systems 44 are brought into close proximity with certain tap points 72 of the tap point drive system 66 such that testing of the wearable devices 16 can be performed according to specific functionality scripts that may, for example, be stored in the memory 96 of the master control system 92. In certain embodiments, the master control system 92 may include one or more communication interfaces 98 that facilitate the master control system 92 communicating (e.g., either wirelessly or through wired connections) with the track drive control systems 60 and the tap point drive control systems 86 via similar communication interfaces of the track drive control systems 60 and the tap point drive control systems 86. In certain embodiments, the one or more processors 94 may include one or more general purpose microprocessors, one or more application specific integrated circuits (ASICs), one or more field programmable logic arrays (FPGAs), or any combination thereof. Further, in certain embodiments, the memory 96 may store data to be processed by the one or more processors 94 and may include one or more tangible, non-transitory, computer-readable media. For example, the memory 96 may include random access memory (RAM), read only memory (ROM), rewritable non-volatile memory such as flash memory, hard drives, optical discs, and/or the like.

Figure 4:
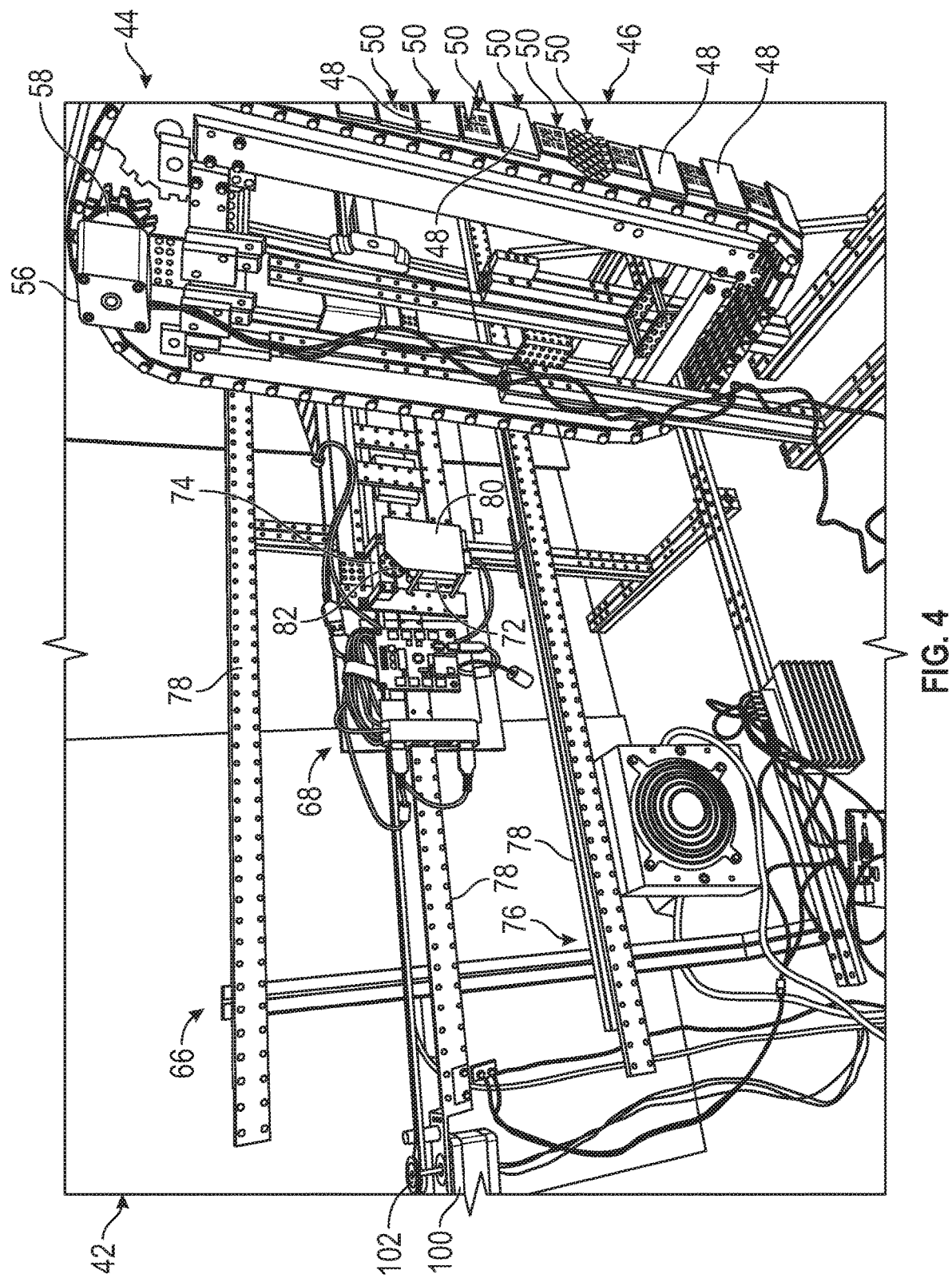
FIG. 4 is a perspective view of a track drive system and a tap point drive system of the wearable device testing system of FIG. 3, in accordance with embodiments of the present disclosure.

FIGS. 4 through 11 are various views of the wearable device testing system 42 of FIG. 3 to further illustrate features of the wearable device testing system 42. For example, FIG. 4 is a perspective view of a track drive system 44 and the tap point drive system 66 of the wearable device testing system 42 of FIG. 3, which illustrates the various features of the track drive system 44 and the tap point drive system 66, such as the plurality of track members 50 that comprise the track 46 of the track drive system 44 (e.g., including the attachment pads 48 to which the wearable devices 16 may be attached), the motor 56 of the track drive system 44 that causes motion of the track members 50 of the track 46 (e.g., via one or more gears 58, in certain embodiments), one of the tap point sliders 68 of the tap point drive system 66 and its associated tap point 72, a motor 74 of one of the tap point sliders 68 that is configured to rotate a respective interference door 80 relative to the respective tap point 72 (i.e., to allow wireless communication between the tap point 72 and a wearable device 16 that is in close proximity with the tap point 72), the plurality of rails 78 upon which the tap point sliders 68 may translate to facilitate lateral sliding of the tap point sliders 68 relative to the track drive system 44, and so forth.

As illustrated in FIG. 4, in certain embodiments, each of the tap point sliders 68 may be associated with a separate motor 100 (e.g., a servo motor, a stepper motor, or any suitable motor) disposed near an end of the respective rail 78, whereby the motor 100 may be configured to cause the translation of the respective tap point slider 68 along the rail 78 using, for example, a pulley system 102 that is attached to the tap point slider 68. It will be appreciated that, in such embodiments, a tap point drive control system 86 may be configured to control operation of the motor 100 similar to the control of the respective motor 74 mounted to the respective tap point slider 68.

Figure 5:
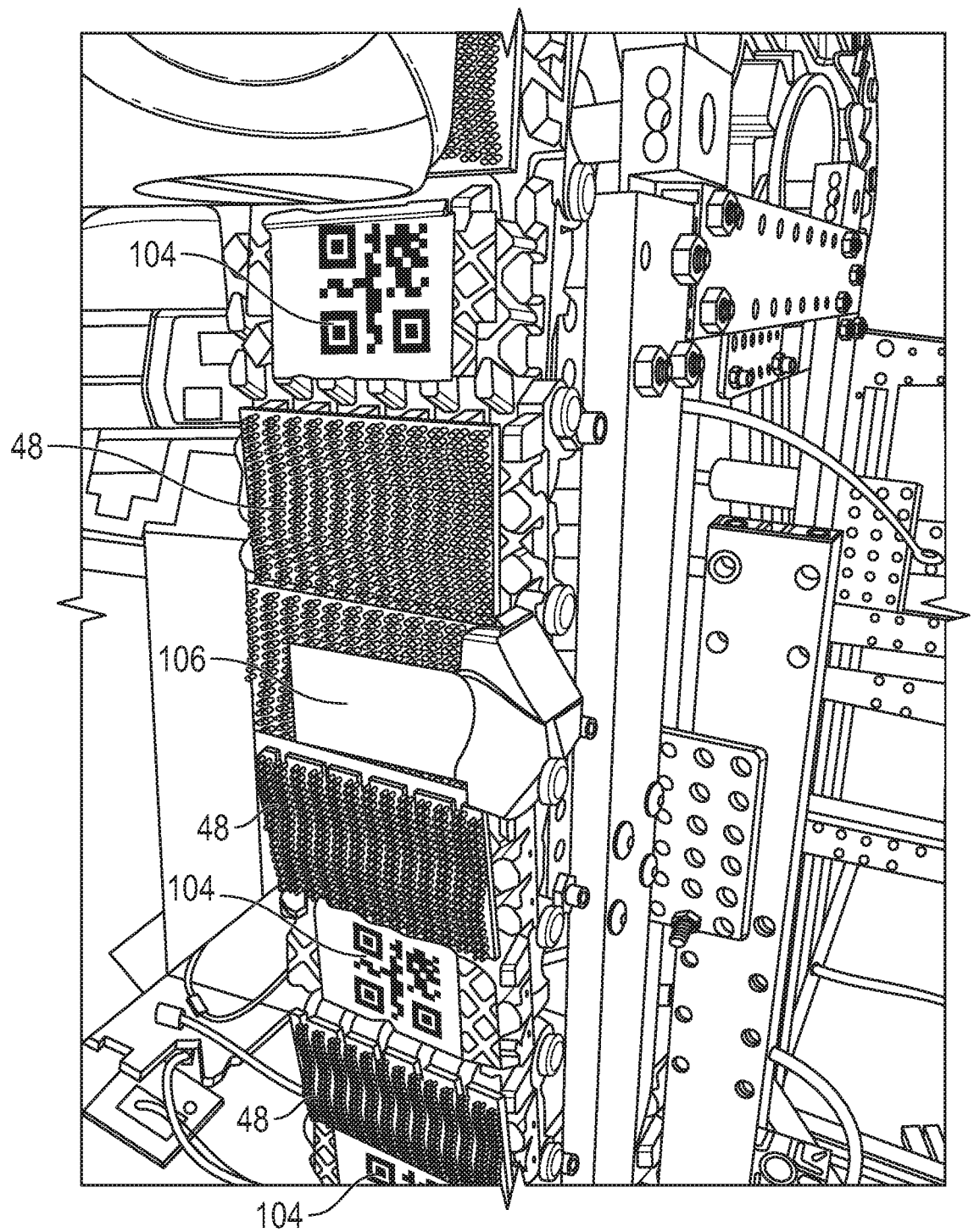
FIG. 5 is a perspective view of a portion of a track of the track drive system of the wearable device testing system of FIG. 3, in accordance with embodiments of the present disclosure.

FIG. 5 is a perspective view of a portion of a track 46 of a track drive system 44 of the wearable device testing system 42 of FIG. 3. As illustrated in FIG. 5, in certain embodiments, the plurality of track members 50 of the track 46 may include certain indexing features that may be used to index a position of the track 46 along the path 52 defined by the track 46 such that the position of any given wearable device 16 attached to one of the attachment pads 48 of the track 46 may be known (e.g., by the track drive control system 60) at any given time. For example, in certain embodiments, the indexing features of the plurality of track members 50 of the track 46 may include optical recognition codes 104 (e.g., quick response (QR) codes, as illustrated in FIG. 5) configured to be detected by one or more optical sensors 116 (e.g., one or more cameras or other optical sensors, as illustrated in FIG. 3) of the track drive system 44 to determine positions of the optical recognition codes 104 along the path 52 defined by the track 46, thereby enabling the track drive control system 60 to know the positioning of the track members 50 along the path 52 defined by the track 46. Alternatively, or in addition to, in certain embodiments, the indexing features of the plurality of track members 50 of the track 46 may include one or more calibration cams 106 configured to physically interact with at least one stationary switch 118 (see, e.g., FIG. 3) disposed along the path 52 defined by the track 46 when the track member(s) 50 coupled to the one or more calibration cams 106 traverse across the at least one stationary switch 118. In such embodiments, the track drive control system 60 may determine when the one or more calibration cams 106 physically interact with the at least one stationary switch 118 such that the track drive control system 60 may know the positioning of the track members 50 along the path 52 defined by the track 46.

In certain embodiments, either (or both) of these types of indexing features may be utilized as part of the track drive system 44 to enable the track drive control system 60 to know the positioning of the track members 50 along the path 52 defined by the track 46. In general, the track drive control system 60 may use the knowledge of the positioning of the track members 50 along the path 52 defined by the track 46 to determine how to actuate the motor 56 (e.g., stepper motor, in certain embodiments) of the track drive system 44 to precisely control the movement of the track members 50 of the track 46 to ensure that a particular wearable device 16 is positioned in close proximity with a particular tap point 72 when desired (e.g., as part of a software testing script).

Figure 6:
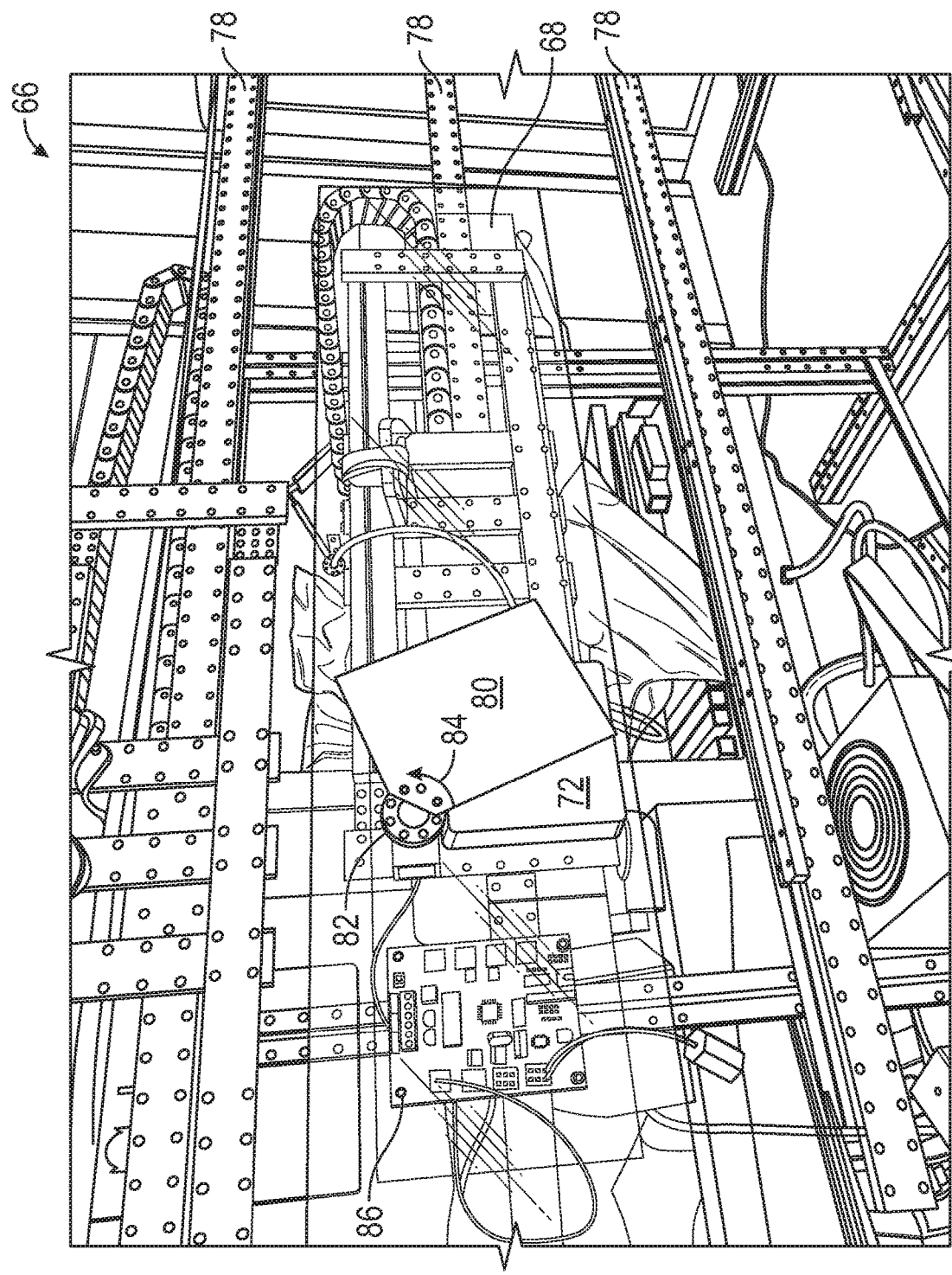
FIGS. 6 and 7 are perspective views of the tap point drive system of the wearable device testing system of FIG. 3 to illustrate an interference door of a tap point slider, in accordance with embodiments of the present disclosure.
Figure 7:
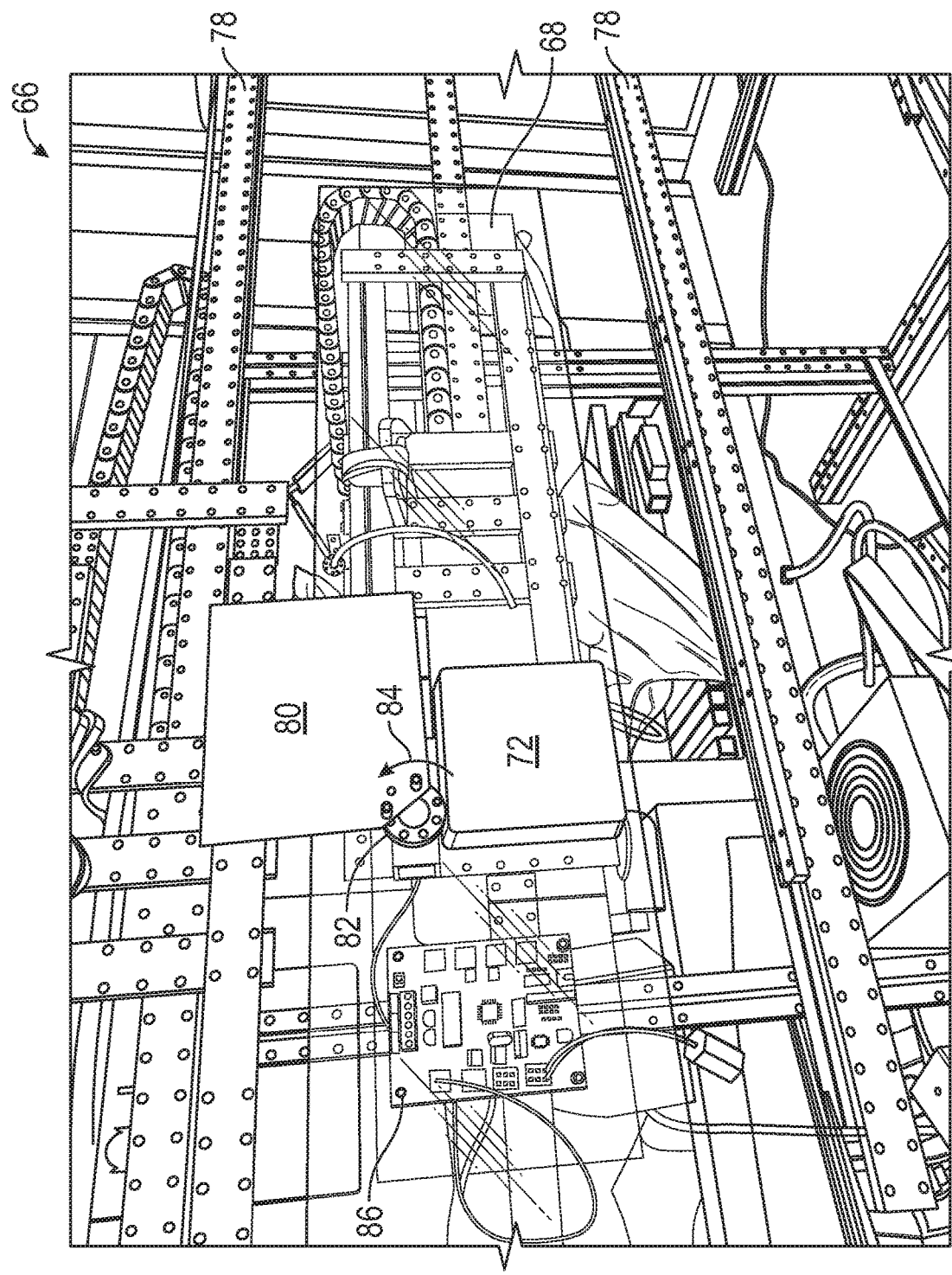

FIGS. 6 and 7 are perspective views of the tap point drive system 66 of the wearable device testing system 42 of FIG. 3 to illustrate an interference door 80 of a tap point slider 68 being moved (e.g., as illustrated by arrow 84) from a first position where wireless communication between a tap point 72 and a wearable device 16 that has been positioned in close proximity to the tap point 72 is blocked, and a second position where wireless communication between the tap point 72 and the wearable device 16 that has been positioned in close proximity to the tap point 72 is no longer blocked.

Figure 8:
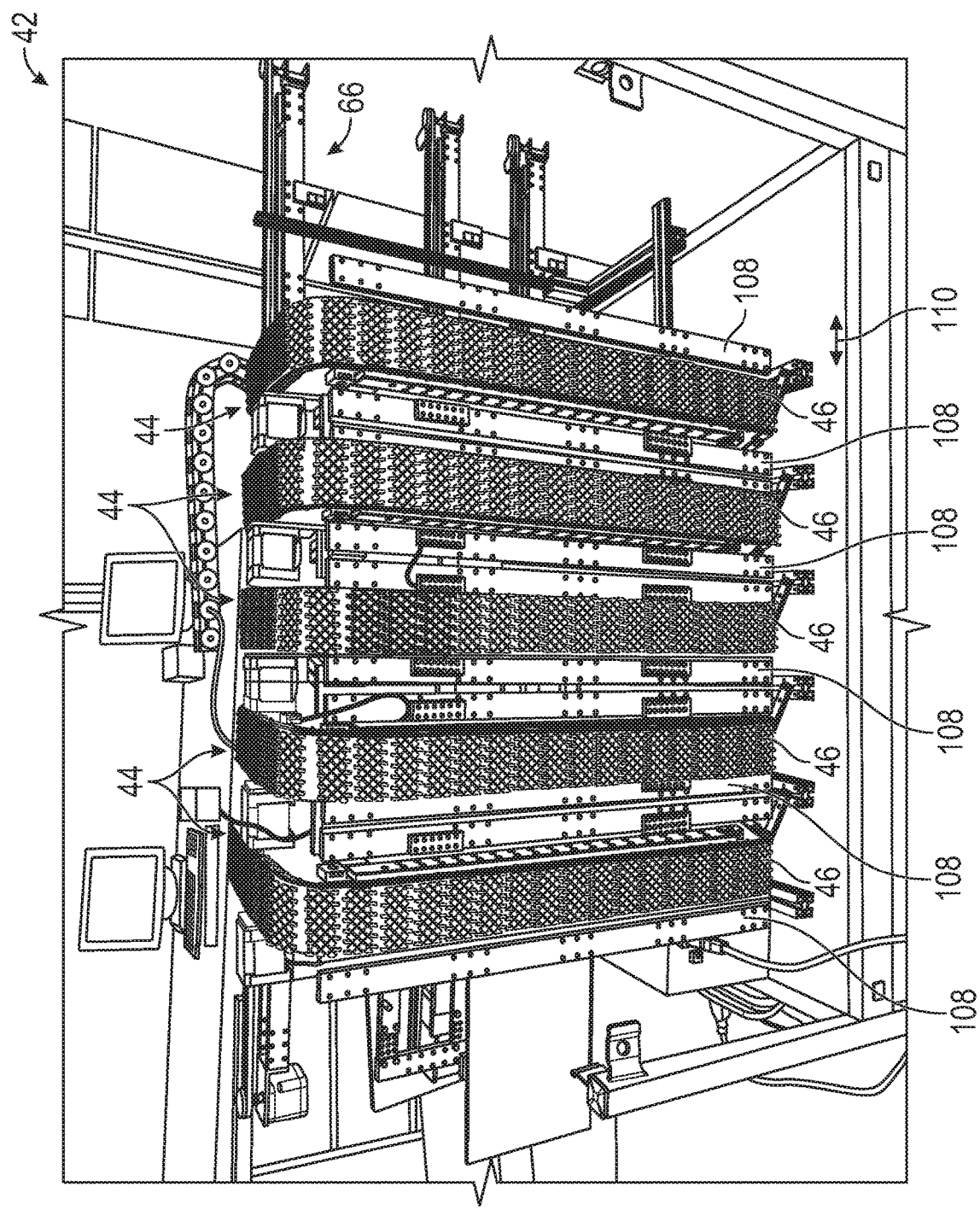
FIG. 8 is a perspective view of the wearable device testing system having a plurality of track drive systems, in accordance with embodiments of the present disclosure.

In the embodiments illustrated in FIGS. 3 and 4, the wearable device testing system 42 only includes one track drive system 44. However, in other embodiments, the wearable device testing system 42 may include more than one track drive system 44. For example, FIG. 8 is a perspective view of the wearable device testing system 42 having a plurality of track drive systems 44. In particular, the wearable device testing system 42 is illustrated in FIG. 8 as having five track drive systems 44. In certain embodiments, the wearable device testing system 42 may include one, two, three, four, five, or even more track drive systems 44. As also illustrated in FIG. 8, in certain embodiments, the plurality of track drive systems 44 may be positioned adjacent each other. Indeed, in certain embodiments, the plurality of track drive systems 44 may each include a respective chassis 108 that supports the respective track 46 and other associated components, and which may each be coupled to each other, thereby maintaining the plurality of track drive systems 44 in fixed positions laterally with respect to each other. However, in other embodiments, the plurality of track drive systems 44 may not be fixed laterally with respect to each other, but rather may be allowed to move laterally with respect to each other. For example, in certain embodiments, each respective chassis 108 may include a separate drive system that enables the chassis 108 to move laterally (e.g., as illustrated by arrows 110) such that the respective track drive system 44 may similarly move laterally with respect to the other track drive systems 44.

Figure 9:
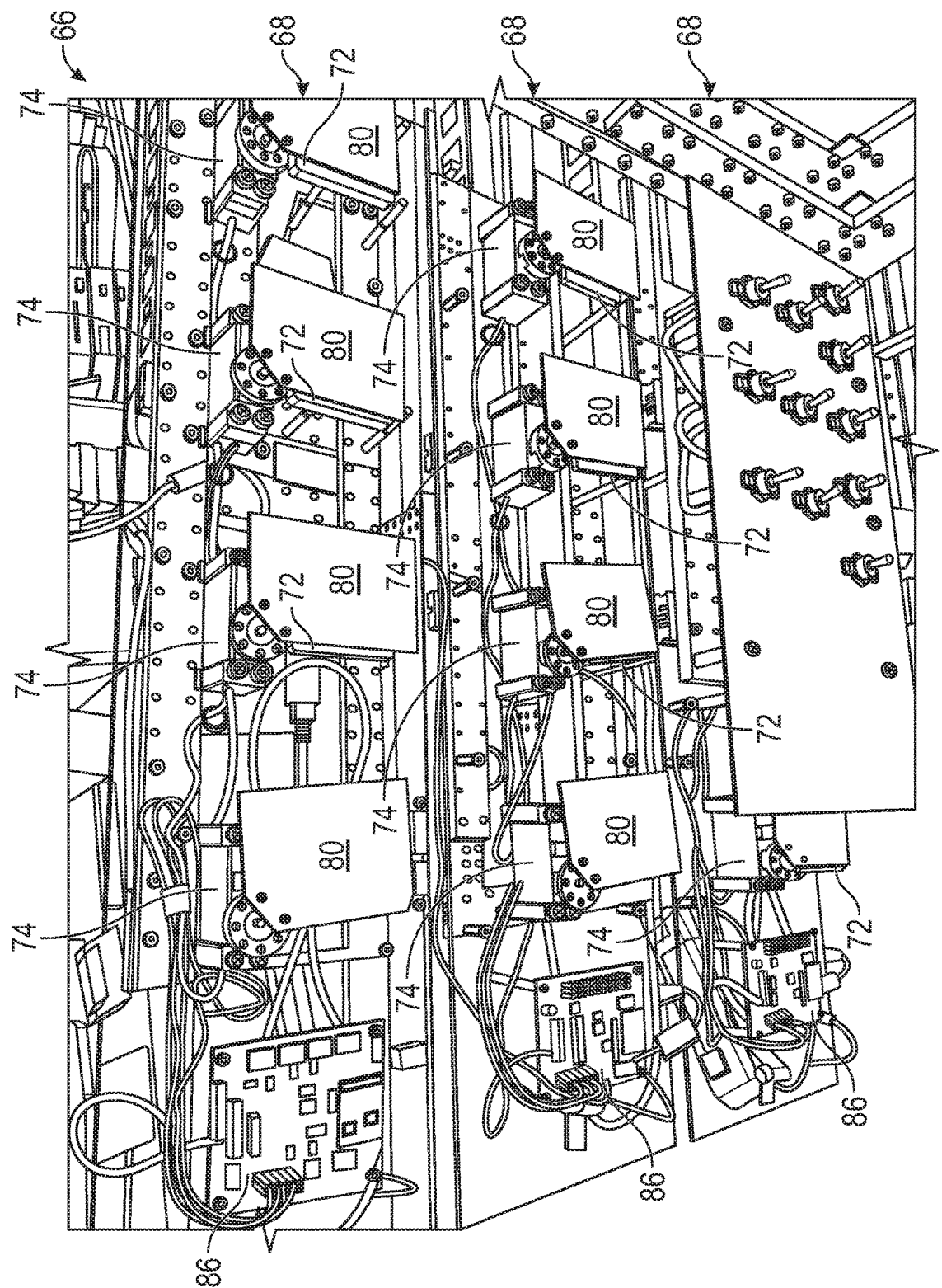
FIG. 9 is a perspective view of a plurality of tap point sliders, each tap point slider including a plurality of tap points, in accordance with embodiments of the present disclosure.

In addition, in the embodiments illustrated in FIGS. 3, 4, 6, and 7, each tap point slider 68 only includes one tap point 72 (and associated components, such as the associated motor 74, interference door 80, and so forth). However, in other embodiments, the tap point sliders 68 may include more than one tap point 72 (and associated components, such as the associated motor 74, interference door 80, and so forth). For example, FIG. 9 is a perspective view of a plurality of tap point sliders 68, each tap point slider 68 including a plurality of tap points 72 (and associated components, such as the associated motor 74, interference door 80, and so forth). In certain embodiments, each tap point slider 68 may include one, two, three, four, five, or even more tap points 72 (and associated components, such as the associated motor 74, interference door 80, and so forth). In certain embodiments, each of the plurality of tap points 72 (and associated components, such as the associated motor 74, interference door 80, and so forth) may be in fixed positions relative to the respective tap point slider 68. However, in other embodiments, the plurality of tap points 72 (and associated components, such as the associated motor 74, interference door 80, and so forth) may not be fixed relative to each other on the respective tap point slider 68, but rather may be allowed to move with respect to each other along the length of the respective tap point slider 68. For example, in certain embodiments, each tap point 72 (and associated components, such as the associated motor 74, interference door 80, and so forth) may be associated with a separate drive system that enables the tap point 72 (and associated components, such as the associated motor 74, interference door 80, and so forth) to move relative to the respective tap point slider 68.

Figure 10:
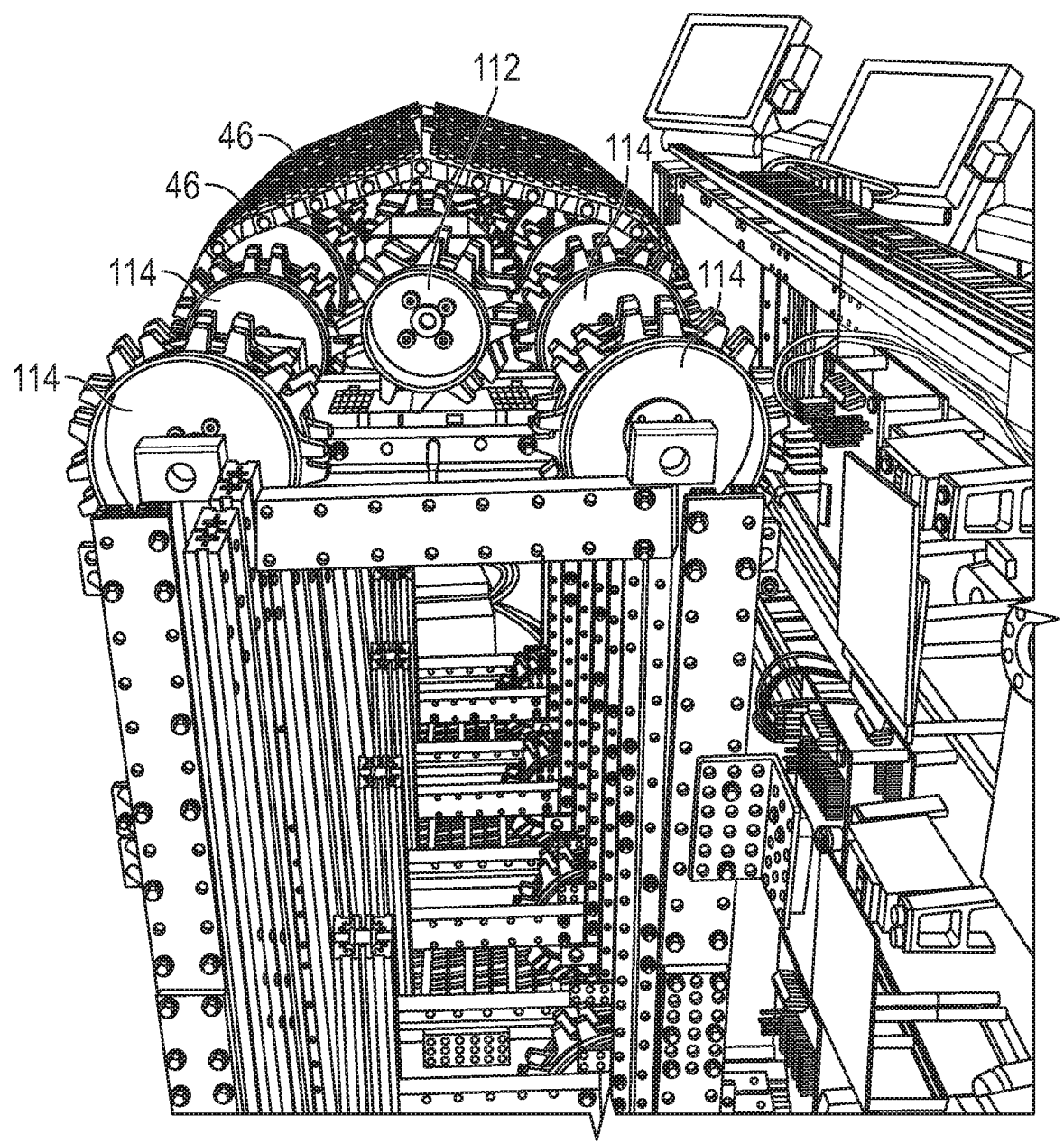
FIG. 10 is a side view of a track drive system with the track removed for illustration purposes to show certain gears of the track drive system, in accordance with embodiments of the present disclosure.
Figure 11:
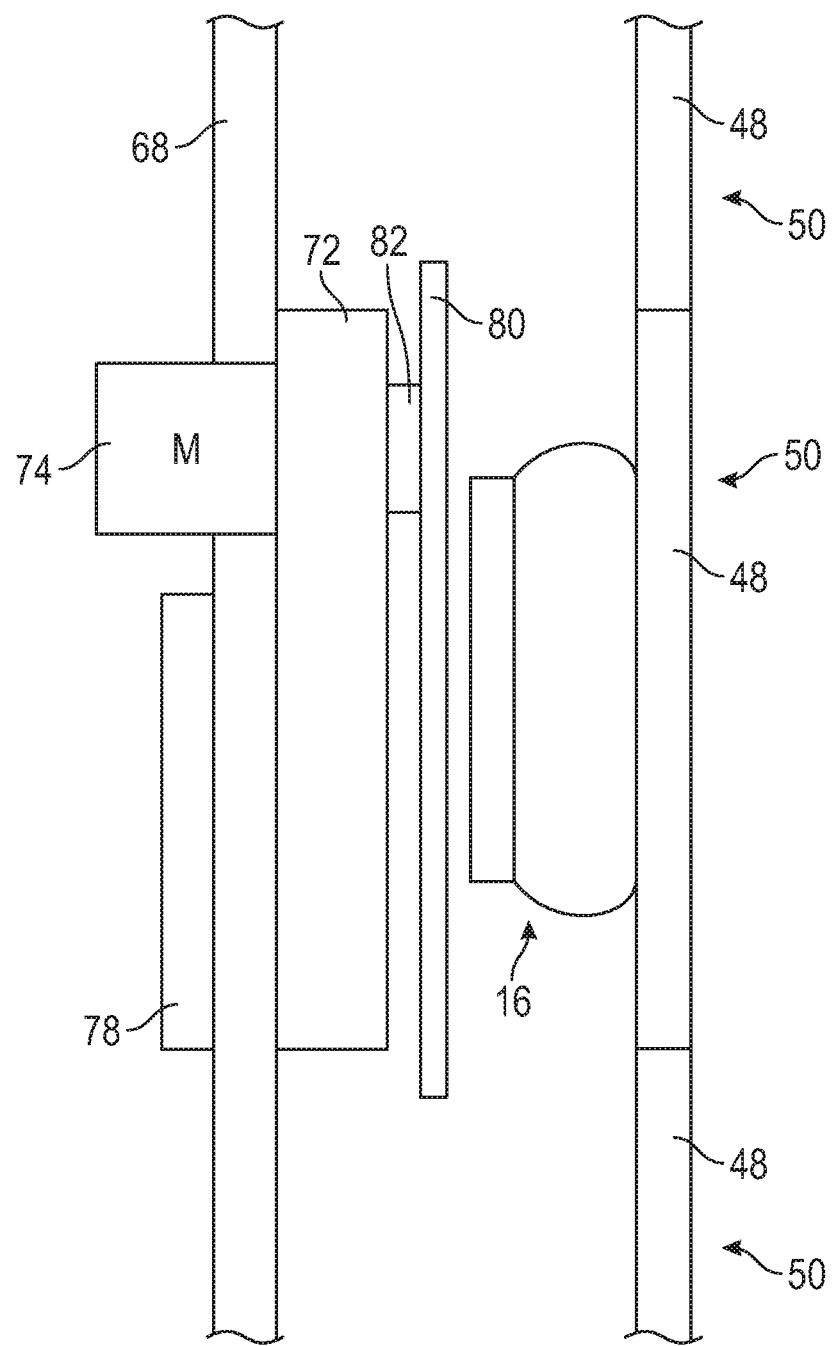
FIG. 11 is a side view of a particular wearable device that has been brought into close proximity with a particular tap point, in accordance with embodiments of the present disclosure.

As described herein, in certain embodiments, the track drive systems 44 may include gears 58 that are driven by a motor 56 to cause the track 46 to move along the path 52 defined by the track 46. FIG. 10 is a side view of a track drive system 44 with the track 46 removed for illustration purposes to show certain gears 58 of the track drive system 44. In particular, in certain embodiments, the gears 58 of the track drive systems 44 may include at least one drive gear 112, which may be directly driven by the motor 56, and a plurality of driven gears 114 that are driven by the at least one drive gear 112 such that the gears 112, 114 may cause the track 46 to move along the path 52 defined by the track 46.

In addition, in certain embodiments, the wearable device testing system 42 may include one or more optical sensors 116 located proximate a respective track drive system 44, and configured to perform optical verification of the display 22 of each of the wearable devices 16, for example, by image comparison, optical character recognition, or some combination thereof. For example, in certain embodiments, the wearable devices 16 may provide active visual feedback for a number of situations, such as notification that a particular ride is ready, or displaying special entitlements for the patron using the particular wearable device 16. In such embodiments, the track drive systems 44 include one or more optical sensors 116 positioned in front of a wearable device 16 to facilitate real-time analysis and validation of test cases relating to such image comparison and/or optical character recognition. In addition, in certain embodiments, the wearable device testing system 42 may include haptic sensors that are configured to detect when certain wearable devices 16 vibrate (e.g., when patrons are alerted to certain messages) to facilitate real-time analysis and validation of test cases relating to such haptic messaging.

Returning now to FIG. 3, as described herein, the track drive systems 44 and the tap point sliders 68 of the wearable device testing system 42 may be controlled by the master control system 92 (and, in certain embodiments, in conjunction with the respective control systems 60, 86 of the track drive systems 44 and the tap point sliders 68) to move the wearable devices 16 that are attached to the tracks 46 of the track drive systems 44 relative to the tap points 72 of the tap point sliders 68 to enable testing of the functionality of software stored in the wearable devices 16. In particular, in certain embodiments, the master control system 92 may coordinate the relative movement of the wearable devices 16 relative to certain tap points 72 to test certain functionalities of the wearable devices 16 according to a plurality of test scripts, which may for example, be stored in the memory 96 of the master control system 92, and which may be executed by the processor 94 of the master control system 92.

More specifically, in certain embodiments, the master control system 92 may send control signals to the respective control systems 60, 86 of the track drive systems 44 and the tap point sliders 68 to cause the tracks 46 and the tap point sliders 68 to move according to a particular test script such that a particular wearable device 16 is brought into close proximity with a particular tap point 72 at a particular time. For example, in certain embodiments, the master control system 92 may send control signals to the track drive control systems 60 to control the respective motors 56 to drive the respective gears 58 to cause the respective tracks 46 to move along the paths 52 defined by the tracks 46, and may send control signals to the tap point drive control systems 86 to control the respective motors 74, 100 to drive, for example, the respective pulley systems 102 to cause the respective tap point sliders 68 to move laterally with respect to the track drive systems 44.

In certain embodiments, once the particular wearable device 16 is brought into close proximity with the particular tap point 72 (see, e.g., FIG. 11), the master control system 92 may send a control signal to the respective tap point drive control system 86 to control the respective motor 74 to move the respective interference door 80 relative to the respective pivot point 82 of the particular tap point 72 such that the particular wearable device 16 and the particular tap point 72 may wirelessly communicate with each other. Then, the master control system 92 may either receive confirmation from the particular tap point 72 that the particular wearable device 16 wirelessly communicated with the particular tap point 72 appropriately, or that there was some problem with the wireless communication. It will be appreciated that the master control system 92 may cause myriad such interactions between the various wearable devices 16 and the various tap points 72 according to the test script being executed by the master control system 92.

In certain embodiments, movement of the track members 50 along the paths 52 defined by the track members 50 of the tracks 46 may be calibrated and indexed by the master control system 92 and/or the respective track drive control systems 60 based on feedback from one or more sensors disposed around the environment of the respective track drive systems 44. For example, in certain embodiments, one or more optical sensors 116 located proximate the track drive system 44 may detect certain indexing features (e.g., such as the optical recognition codes 104 illustrated in FIG. 5) of certain track members 50 of the tracks 46 to determine positions of the track members 50 along the paths 52 defined by the track members 50. In addition, in certain embodiments, at least one stationary switch 118 disposed proximate a respective track 46 may detect when certain indexing features (e.g., such as one or more calibration cams 106 coupled to the track members 50 of the track 46, as illustrated in FIG. 5) traverse across the at least one stationary switch 118 to determine positions of the track members 50 along the paths 52 defined by the track members 50. Regardless of the particular type of indexing features (e.g., such as the optical recognition codes 104 and the calibration cams 106) that are detected by the one or more sensors (e.g., such as the one or more optical sensors 116 and the at least one stationary switch 118), the master control system 92 and/or the respective track drive control systems 60 may receive signals from the sensors indicative of the detected indexing features, and may control movement of the respective tracks 46 based at least in part on the received signals. It will be appreciated that, in certain embodiments, the master control system 92 and/or the tap point drive control systems 86 may similarly calibrate and index the movement of the tap point sliders 68 based on similar sensors located proximate the tap point drive system 66.

Figure 12:
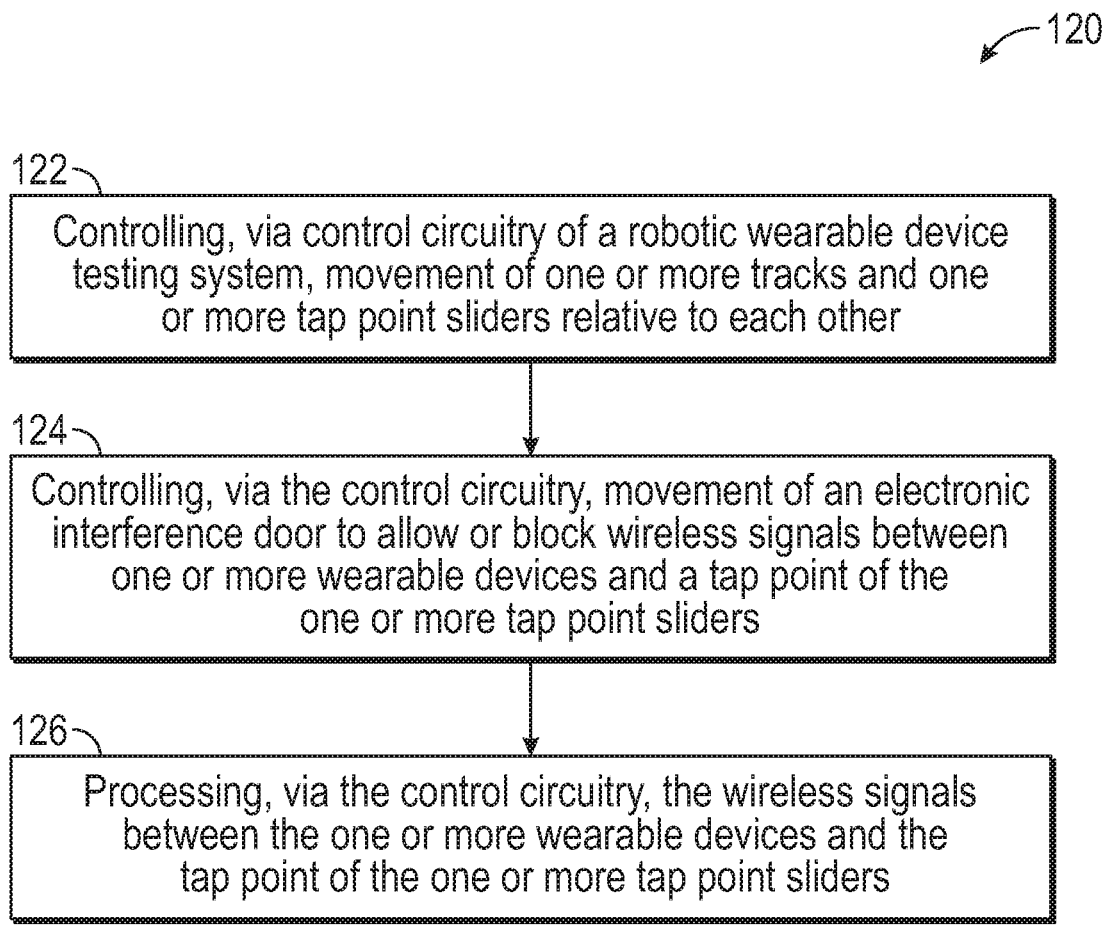
FIG. 12 is a flow diagram of a method of operation of the robotic wearable device testing system, in accordance with embodiments of the present disclosure.

FIG. 12 is a flow diagram of a method 120 of operation of the robotic wearable device testing system 42 described herein. As illustrated, in certain embodiments, the method 120 includes controlling, via control circuitry (e.g., the master control system 92) of the robotic wearable device testing system 42, movement of one or more tracks 46 and one or more tap point sliders 68 relative to each other (e.g., block 122). Each track 46 of the one or more tracks 46 is configured to have one or more wearable devices 16 attached thereto. In addition, each tap point slider 68 of the one or more tap point sliders 68 includes a tap point 72 configured to wirelessly communicate with the one or more wearable devices 16 when the one or more wearable devices 16 are in close proximity with the tap point 72. In addition, each tap point slider 68 of the one or more tap point sliders 68 includes an electronic interference door 80 configured to block wireless signals between the one or more wearable devices 16 and the respective tap point 72. In addition, in certain embodiments, the method 120 includes controlling, via the control circuitry (e.g., the master control system 92), movement of the electronic interference door 80 to allow or block the wireless signals between the one or more wearable devices 16 and a tap point 72 of the one or more tap point sliders 68 (block 124). In addition, in certain embodiments, the method 120 includes processing, via the control circuitry (e.g., the master control system 92), the wireless signals between the one or more wearable devices 16 and the tap point 72 of the one or more tap point sliders 68 (block 126).

While only certain features have been illustrated and described herein, many modifications and changes will occur to those skilled in the art. It is, therefore, to be understood that the appended claims are intended to cover all such modifications and changes as fall within the true spirit of the disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. § 112(f). However, for any claims containing elements designated in any other manner, it is intended that such elements are not to be interpreted under 35 U.S.C. § 112(f).

The invention claimed is:

1. A robotic wearable device testing system, comprising:
a track drive system comprising one or more tracks comprising a plurality of attachment pads configured to attach to one or more wearable devices, wherein each track of the one or more tracks is configured to move along a path defined by the track;
a tap point drive system comprising one or more tap point sliders configured to slide laterally with respect to the track drive system, wherein each tap point slider of the one or more tap point sliders comprises a tap point configured to wirelessly communicate with the one or more wearable devices when the one or more wearable devices are in close proximity with the tap point, and wherein each tap point slider of the one or more tap point sliders comprises an electronic interference door configured to block wireless signals between the one or more wearable devices and the respective tap point; and
control circuitry configured to control relative movement of the one or more tracks and the one or more tap point sliders to position one or more wearable devices attached to respective attachment pads of the plurality of attachment pads in close proximity with a tap point of the one or more tap point sliders, and to control movement of the electronic interference door to allow or block the wireless signals between the one or more wearable devices and the tap point of the one or more tap point sliders.

2. The robotic wearable device testing system of claim 1, wherein each track of the one or more tracks comprises a plurality of track members coupled to each other.

3. The robotic wearable device testing system of claim 2, wherein each attachment pad of the plurality of attachment pads is attached to a respective track member of the plurality of track members.

4. The robotic wearable device testing system of claim 2, wherein each attachment pad of the plurality of attachment pads comprises a respective track member of the plurality of track members.

5. The robotic wearable device testing system of claim 1, wherein the track drive system comprises one or more motors configured to cause movement of a respective track of the one or more tracks along the path defined by the respective track.

6. The robotic wearable device testing system of claim 5, wherein each motor of the one or more motors of the track drive system is configured to cause bidirectional movement of the respective track along the path defined by the respective track.

7. The robotic wearable device testing system of claim 5, wherein the control circuitry is configured to control operation of the one or more motors of the track drive system to control movement of each track of the one or more tracks.

8. The robotic wearable device testing system of claim 1, wherein each track of the one or more tracks comprises one or more indexing track members configured to index a position of the track along the path defined by the track.

9. The robotic wearable device testing system of claim 8, wherein the control circuitry is configured to control movement of the one or more tracks based at least in part on indexed positions of the one or more tracks.

10. The robotic wearable device testing system of claim 8, wherein the one or more indexing track members comprise optical recognition codes configured to be detected by at least one optical sensor.

11. The robotic wearable device testing system of claim 10, wherein the control circuitry is configured to control movement of the track based at least in part on feedback from the at least one optical sensor relating to detection of the optical recognition codes.

12. The robotic wearable device testing system of claim 8, wherein the one or more indexing track members comprise one or more calibration cams configured to interact with at least one stationary switch disposed along the path defined by the track.

13. The robotic wearable device testing system of claim 12, wherein the control circuitry is configured to control movement of the track based at least in part on feedback from the at least one stationary switch relating to interaction with the one or more calibration cams.

14. The robotic wearable device testing system of claim 1, wherein the tap point drive system comprises one or more motors configured to cause movement of the one or more tap point sliders along respective rails of the tap point drive system.

15. The robotic wearable device testing system of claim 14, wherein the one or more motors of the tap point drive system are configured to cause bidirectional movement of the one or more tap point sliders along the respective rails of the tap point drive system.

16. The robotic wearable device testing system of claim 14, wherein the control circuitry is configured to control operation of the one or more motors of the tap point drive system to control movement of each tap point slider of the one or more tap point sliders.

17. The robotic wearable device testing system of claim 1, wherein the track drive system comprises five or more tracks.

18. The robotic wearable device testing system of claim 1, wherein the tap point drive system comprises three or more tap point sliders.

19. The robotic wearable device testing system of claim 1, wherein the control circuitry is configured to process wireless signals between the one or more wearable devices and the tap point of the one or more tap point sliders.

20. The robotic wearable device testing system of claim 1, wherein the one or more wearable devices comprise theme park wearable devices.

21. A method comprising:
controlling, via control circuitry of a robotic wearable device testing system, movement of one or more tracks and one or more tap point sliders relative to each other, wherein each track of the one or more tracks is configured to have one or more wearable devices attached thereto, wherein each tap point slider of the one or more tap point sliders comprises a tap point configured to wirelessly communicate with the one or more wearable devices when the one or more wearable devices are in close proximity with the tap point, and wherein each tap point slider of the one or more tap point sliders comprises an electronic interference door configured to block wireless signals between the one or more wearable devices and the respective tap point;
controlling, via the control circuitry, movement of the electronic interference door to allow or block the wireless signals between the one or more wearable devices and a tap point of the one or more tap point sliders; and
processing, via the control circuitry, the wireless signals between the one or more wearable devices and the tap point of the one or more tap point sliders.

* * * * *